United States Patent
Kim

(10) Patent No.: US 8,953,392 B2
(45) Date of Patent: Feb. 10, 2015

(54) LATENCY CONTROL DEVICE AND SEMICONDUCTOR DEVICE INCLUDING THE SAME

(71) Applicant: SK Hynix Inc., Icheon-si Gyeonggi-do (KR)

(72) Inventor: Tae Kyun Kim, Jeollanam-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/077,641

(22) Filed: Nov. 12, 2013

(65) Prior Publication Data

US 2015/0009765 A1     Jan. 8, 2015

(30) Foreign Application Priority Data

Jul. 5, 2013   (KR) .................. 10-2013-0079073

(51) Int. Cl.
  *G11C 7/10*         (2006.01)
  *G11C 11/4063*      (2006.01)

(52) U.S. Cl.
  CPC ............................ *G11C 11/4063* (2013.01)
  USPC ................. 365/189.05; 365/194; 365/233.14; 365/189.02; 365/189.15; 365/230.03

(58) Field of Classification Search
  CPC .. G11C 7/222; G11C 11/4076; G11C 11/408; G11C 11/4082; G11C 11/4087; G11C 2207/2281; G11C 7/1018; G11C 7/1072; G11C 7/225

USPC ................. 365/189.05, 194, 230.03, 233.14, 365/230.01, 189.02, 189.15, 228

See application file for complete search history.

(56) References Cited

U.S. PATENT DOCUMENTS

| | | | |
|---|---|---|---|
| 7,737,752 B2 | 6/2010 | Eaton et al. | |
| 2006/0145894 A1 | 7/2006 | Kim et al. | |
| 2010/0177589 A1* | 7/2010 | Kinoshita et al. | ........ 365/233.11 |

FOREIGN PATENT DOCUMENTS

KR   1020060077551 A   7/2006

* cited by examiner

*Primary Examiner* — Thong Q Le
(74) *Attorney, Agent, or Firm* — William Park & Associates Patent Ltd.

(57) ABSTRACT

A latency control device and a semiconductor device including the same are disclosed. The latency control device includes: a code setting unit configured to output a plurality of coding signals by setting a code value having a specific delay amount in response to a code signal; a latch unit configured to latch a command signal for a predetermined time; a period control unit configured to control a delay amount of a period signal in response to an output signal of the latch unit; a selection unit configured to output an oscillation signal synchronized with the clock signal in response to the selection signal, or synchronize the oscillation signal with an output signal of the period control unit; a register unit configured to output a plurality of period signals by dividing the oscillation signal; and a comparator configured to compare the plurality of coding signals with the plurality of period signals so as to output the self-latency signal.

29 Claims, 9 Drawing Sheets

LATENCY CONTROL DEVICE AND SEMICONDUCTOR DEVICE INCLUDING THE SAME

CROSS-REFERENCE TO RELATED APPLICATION

This application claims priority under 35 U.S.C 119(a) to Korean patent application No. 10-2013-0079073, filed on Jul. 5, 2013, in the Korean Intellectual Property Office, which is incorporated herein by reference in its entirety as set forth in full.

BACKGROUND

1) Technical Field

Embodiments of the present invention relate to a latency control device and a semiconductor device including the same, and more particularly to a technology for improving a screen-test throughput by controlling latency.

2) Description of the Related Art

Multiple semiconductor devices contained in a system are configured to communicate with each other. For example, if a system controller of a semiconductor memory device such as a DRAM performs a read command, the memory device outputs stored data to a controller.

However, when the memory device receives a read command, the memory device may immediately output data. A predetermined time may be required for the memory device to perform a read command because data is retrieved from the memory device and the retrieved data is arranged and output during the predetermined time.

For mutual operations of multiple semiconductor devices, there is a need to define a standby time in which a specific signal is applied to the semiconductor device and the operation corresponding to the specific signal is then carried out. The standby time is referred to as a latency. For example, a specific time in which a read command is applied to a DRAM and data is then output is referred to as a CAS latency (CL).

Assuming that the CAS latency (CL) is denoted by 'CL=5 clocks (tCK)', data should be output through a DQ pad of a DRAM after lapse of 5 clocks starting from a time at which a read command is applied to an input pad of the DRAM. A latency control circuit is configured to adjust a time delay of an input signal in such a manner that an operation corresponding to various signals applied to the semiconductor device can be carried out at an accurate time point in accordance with latency associated with performing the operation.

However, when inputting or outputting data, a synchronous semiconductor device is synchronized with an external clock received from an external part. Accordingly, a conventional latency control circuit operates in synchronization with a clock signal, so that latency is limited to a minimum delay unit of a time period of the clock signal.

In addition, the conventional latency control circuit is coupled in series to a flip-flop so as to successively process a plurality of signals arranged at predetermined time intervals shorter than a maximum delay amount. The conventional latency control circuit is configured to perform a serial shift operation through the flip-flop so as to process contiguous command signals.

Accordingly, a minimum latency delay amount or a maximum latency delay amount is limited to "(clock period)×(number of flip-flops)". That is, the clock period may correspond to a minimum delay amount, where the minimum delay unit operates in synchronization with the clock signal. In addition, the maximum delay amount is denoted by "(clock period)×(number of flip-flops)". The above-mentioned characteristics may limit a screen test throughput.

BRIEF SUMMARY OF THE INVENTION

Various embodiments of the present invention are directed to providing a latency control device and a semiconductor device including the same that substantially obviates one or more problems due to limitations and disadvantages of the related art.

An embodiment of the present disclosure relates to a latency control device and a semiconductor device including the same, which can improve a screen-test throughput through setting of a code corresponding to a desired delay amount.

In accordance with an aspect of an embodiment, a semiconductor device includes: a latency unit configured to output a normal latency signal synchronized with a clock signal; a self-latency unit configured to output a self-latency signal synchronized with the clock signal in response to a selection signal, or control a period of the self-latency signal in an asynchronous manner in response to the selection signal; and a selection unit configured to select any one of the normal latency signal and the self-latency signal so as to output a latency control signal.

In accordance with another aspect of an embodiment, a latency control device includes: a code setting unit configured to output a plurality of coding signals by setting a code value having a specific delay amount in response to a code signal; a latch unit configured to latch a command signal for a predetermined time; a period control unit configured to control a delay amount of a period signal in response to an output signal of the latch unit; a selection unit configured to output an oscillation signal synchronized with the clock signal in response to the selection signal, or synchronize the oscillation signal with an output signal of the period control unit; a register unit configured to output a plurality of period signals by dividing the oscillation signal; and a comparator configured to compare the plurality of coding signals with the plurality of period signals so as to output the self-latency signal.

It is to be understood that both the foregoing general description and the following detailed description of the present invention are for example and explanatory and are intended to provide further explanation of the invention as claimed.

BRIEF DESCRIPTION OF THE DRAWINGS

The above and other features and advantages of the present disclosure will become readily apparent by reference to the following detailed description when considered in conjunction with the accompanying drawings wherein.

DESCRIPTION OF EMBODIMENTS

Reference will now be made in detail to embodiments of the present disclosure, examples of which are illustrated in the accompanying drawings. Wherever possible, the same reference numbers will be used throughout the drawings to refer to the same or like parts.

Figure 1:
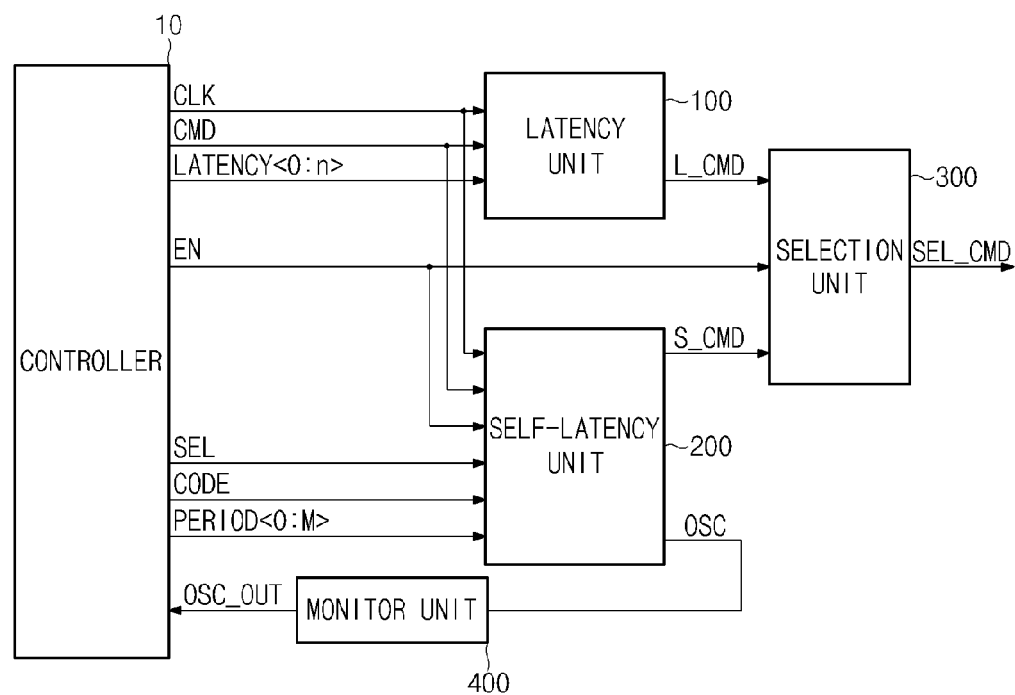
FIG. 1 is a block diagram illustrating a semiconductor device including a latency control device according to an embodiment.

FIG. 1 is a block diagram illustrating a semiconductor device including a latency control device according to an embodiment.

Referring to FIG. 1, the semiconductor device may include a controller 10, a latency unit 100, a self-latency unit 200, a selection unit 300, and a monitor unit 400.

The controller 10 may output a clock signal (CLK), a command signal (CMD), and a latency signal (LATENCY<0:n>) to the latency unit 100. The controller 10 may output an enable signal (EN) to the selection unit 300. The controller 10 may output the clock signal (CLK), the command signal (CMD), the enable signal (EN), a selection signal (SEL), a code signal (CODE), and a period signal PERIOD<0:M> to the self-latency unit 200. In addition, the controller 10 may receive a monitoring signal (OSC_OUT) from the monitor unit 400.

The controller 10 may output a variety of control signals including the clock (CLK) and the selection signal (SEL) to the latency unit 100 and/or the self-latency unit 200 so as to control the latency operation. The controller 10 receives the monitoring signal (OSC_OUT) as an input, and monitors a period signal operating in the latency circuit so as to determine whether a period control operation is correctly achieved.

The latency unit 100 receives the clock signal (CLK), the command signal (CMD), and the latency signal (LATENCY<0:n>) so as to adjust a latency delay amount, and then outputs a normal latency signal (L_CMD).

The self-latency unit 200 receives the clock signal (CLK), the command signal (CMD), the enable signal (EN), the selection signal (SEL), the code signal (CODE), and the periodic signal PERIOD<0:M> so as to adjust a self-latency delay amount, such that the self-latency unit 200 outputs a self-latency signal (S_CMD) and an oscillation signal (OSC). The enable signal (EN) may determine whether the self-latency unit 200 operates or stops. Activation or deactivation of the enable signal (EN) is decided by the controller 10.

The selection unit 300 selects any one of the normal latency signal (L_CMD) and the self-latency signal (S_CMD) in response to the enable signal (EN), and outputs a latency control signal (SEL_CMD).

That is, if the normal latency signal (L_CMD) is selected, the latency control device according to an embodiment may be synchronized with the clock signal (CLK). If the self-latency signal (S_CMD) is selected, the latency control device may be synchronized with the clock signal (CLK) or may operate asynchronously. The self-latency unit 200 may be synchronized with the clock signal (CLK) in response to the selection signal (SEL) in a different way than the latency unit 100, or the self-latency unit 200 may select/control an asynchronous operation period in response to the selection signal (SEL). Synchronous or asynchronous operations may be determined based on a control signal of the controller 10. In one embodiment, as described herein, in response to the selection signal (SEL), the self-latency unit 200 may be configured to output the self-latency signal (S_CMD) synchronized with the clock signal (CLK). Also, in response to the selection signal (SEL), the self-latency unit 200 may be configured to control a period of the self-latency signal (S_CMD) in an asynchronous manner.

The monitor unit 400 may monitor the oscillation signal (OSC) and output a monitoring signal (OSC_OUT) to an external device and/or the controller 10. The controller 10 may determine whether a period operation control failure has occurred based on a time period of the monitoring signal (OSC_OUT).

Figure 2:
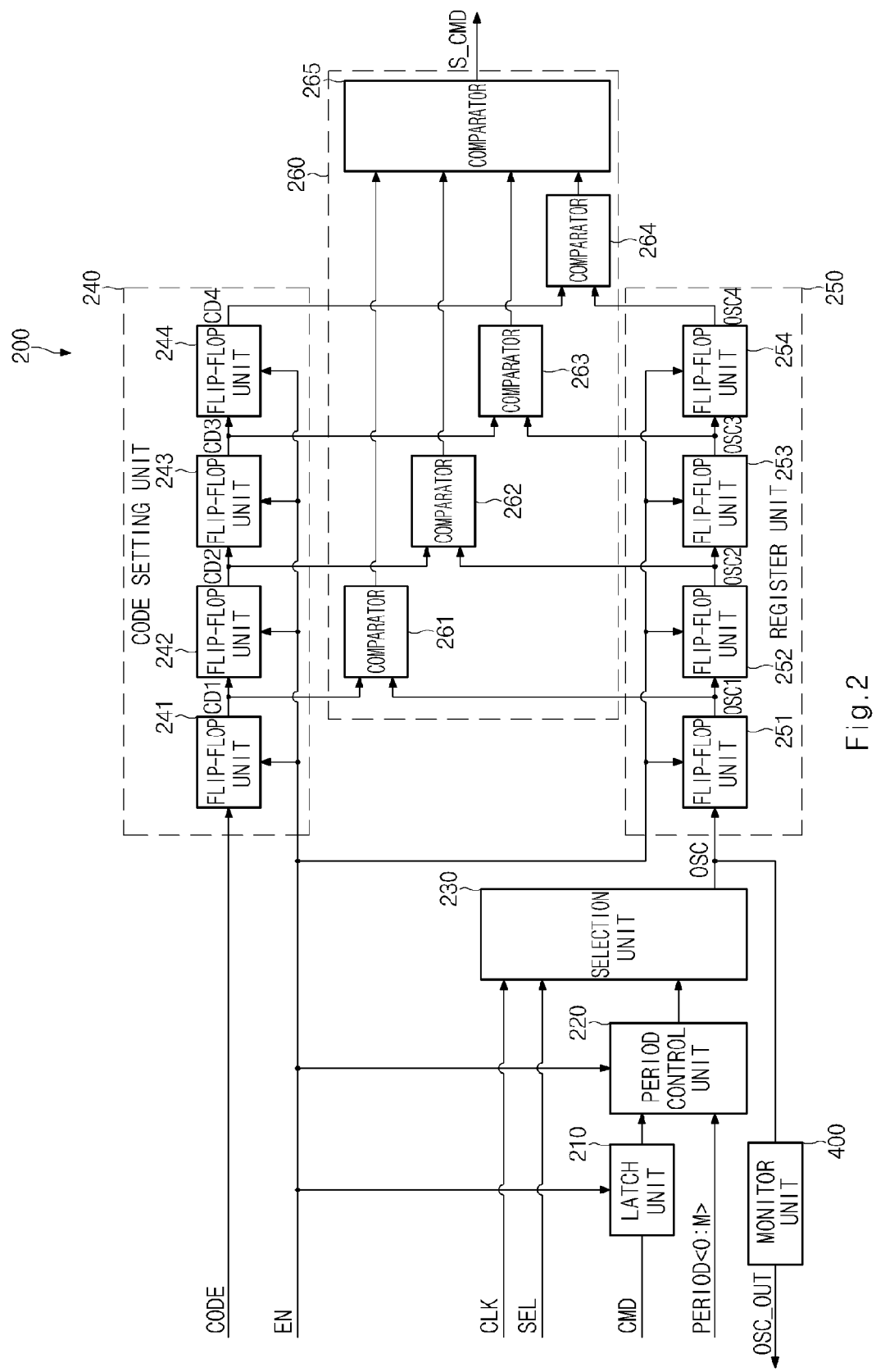
FIG. 2 is a detailed circuit diagram illustrating a self-latency unit shown in FIG. 1.

FIG. 2 is a detailed circuit diagram illustrating the self-latency unit 200 shown in FIG. 1.

Referring to FIG. 2, the self-latency unit 200 includes a latch unit 210, a period control unit 220, a selection unit 230, a code setting unit 240, a register unit 250, and a comparator 260.

The latch unit 210 may latch a command signal (CMD) in response to the enable signal (EN), and output the latched result. The latch unit 210 may be implemented as an SR latch.

The period control unit 220 may control a time period and/or a delay amount of a period signal PERIOD<0:M> in response to the enable signal (EN) and an output signal of the latch unit 210, and the period control unit 220 may output a result of controlling the time period of the period signal PERIOD<0:M>. The period signal PERIOD<0:M> is a self-generated period signal. The period control unit 220 may be adjusted in response to a state of the period signal PERIOD<0:M>.

The selection unit 230 may select at least one period signal from among the clock signal (CLK) and the output signal of the period control unit 220 in response to the selection signal (SEL), such that the selection unit 230 may output an oscillation signal (OSC) corresponding to the selected period signal. If the selection unit 230 selects the clock signal (CLK), the oscillation signal (OSC) operates in a synchronous manner. If the selection unit 230 selects the output signal of the period control unit 220, the oscillation signal (OSC) operates in an asynchronous manner. Here, the selection signal (SEL) may be controlled by the controller 10.

In addition, the code setting unit 240 receives the code signal (CODE) in response to the enable signal (EN), and stores a code value corresponding to a desired delay amount. That is, the code setting unit 240 may store a desired code value according to the number of times a pulse-shaped code signal (CODE) is input to the code setting unit 240. The controller 10 may control the number of times the pulse-shaped code signal (CODE) is input into the code setting unit 240.

The code setting unit 240 may perform serial setting of the code signal (CODE), and output a plurality of coding signals (CD1~CD4). The code setting unit 240 includes a plurality of flip-flop units (241~244) to divide the code signal (CODE). The flip-flop units (241~244) may output a plurality of coding signals (CD1~CD4) by dividing the code signal (CODE) in response to the enable signal (EN).

The register unit 250 divides the oscillation signal (OSC) in response to the enable signal (EN) so as to output a plurality of period signals (OSC1, OSC2, OSC3, OSC4). The register unit 250 includes a plurality of flip-flop units (251~254). The flip-flop units (251~254) may output a plurality of period signals (OSC1, OSC2, OSC3, OSC4) by dividing the oscillation signal (OSC) in response to the enable signal (EN).

In addition, the comparator 260 includes a plurality of comparators (261~265) to compare output signals of the flip-flop units (241~244) with output signals of the flip-flop units (251~254). The comparator 261 may compare a coding signal CD1 with a period signal (OSC1), and output the result of the comparison. The comparator 262 may compare a coding signal (CD2) with a period signal (OSC2), and output the result of the comparison. The comparator 263 may compare a coding signal (CD3) with a period signal (OSC3), and output the result of the comparison. The comparator 264 may compare a coding signal (CD4) with a period signal (OSC4), and output the result of the comparison.

The comparator 265 compares output signals of the comparators (261~264) with each other and outputs a self-latency signal (S_CMD) based on the result of the comparison. The comparator 265 compares code values of a plurality of initial input coding signals (CD1~CD4) with code values of a plurality of period signals (OSC1, OSC2, OSC3, OSC4) received after lapse of a delay time of the latch unit 210. If the code values of the input coding signals (CD1~CD4) are equal to those of the period signals (OSC1, OSC2, OSC3, OSC4), the comparator 265 enables the self-latency signal (S_CMD) and outputs the enabled self-latency signal (S_CMD).

Although in one embodiment each of the code setting unit 240 and the register unit 254 includes four flip-flop units, the scope or spirit of the embodiment is not limited thereto. In other embodiments the code setting unit 240 and the register unit 254 may include more or fewer flip-flop units. Thus, the range of a delay may be adjusted based on the number of flip-flop units included in the code setting unit 240 and the register unit 254. Further, as disclosed above, the code setting unit 240, the latch unit 210, the period control unit 220, and the register unit 250 may operate in response to the enable signal (EN). In other words, in one embodiment, activation states of the code setting unit 240, the latch unit 210, the period control unit 220, and the register unit 250 are controlled in response to the enable signal (EN) received from the controller 10.

Figure 3:
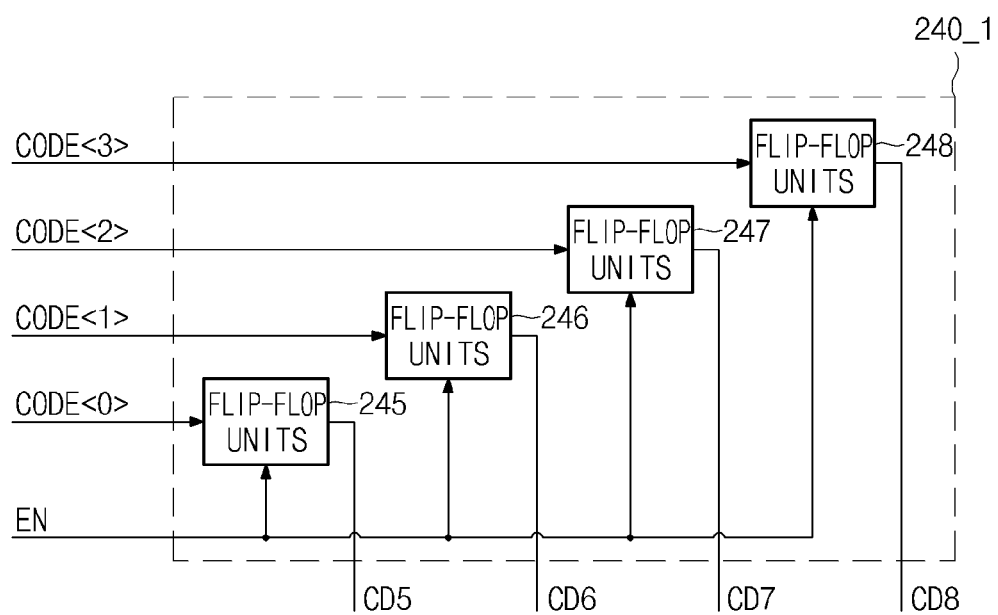
FIG. 3 is a block diagram illustrating a code setting unit of FIG. 2 according to another embodiment.

FIG. 3 is a block diagram illustrating the code setting unit 240 of FIG. 2 according to an embodiment.

In the embodiment of FIG. 2, the code setting unit 240 performs serial setting of the code signal (CODE). However, the code setting unit 240_1 shown in FIG. 3 receives a plurality of code signals CODE<0:3> in a parallel manner in response to the enable signal (EN) so as to output a plurality of coding signals (CD5~CD8).

That is, the code setting unit (240_1) simultaneously receives the plurality of code signals CODE<0:3> so as to simultaneously receive desired code values. If the controller 10 outputs a single code signal (CODE), the code values (CD1~CD4) may be may be determined in a serial manner. If the controller 10 simultaneously outputs a plurality of code signals CODE<0:3>, code values (CD5~CD8) may be determined in a parallel manner.

Figure 4:
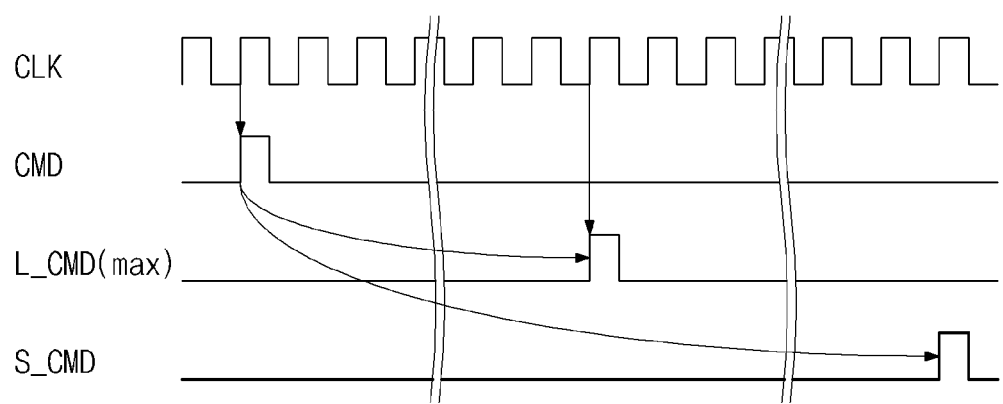
FIGS. 4 and 5 are timing diagrams illustrating operations of the latency control device shown in FIG. 1.
Figure 5:
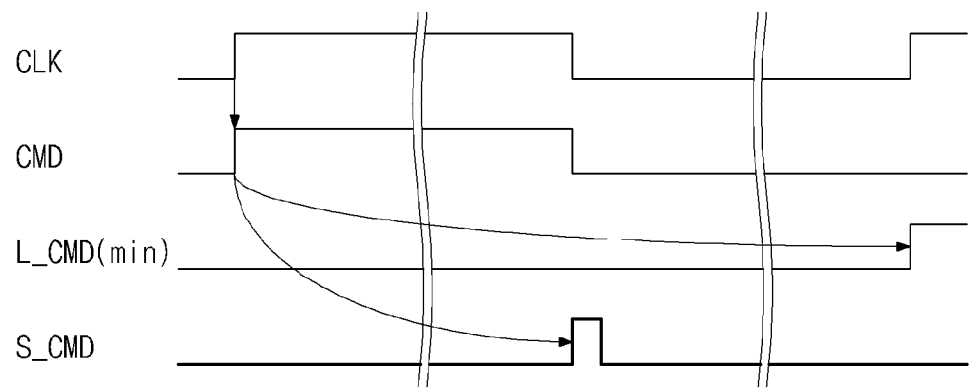

FIGS. 4 and 5 are timing diagrams illustrating operations of the latency control device shown in FIG. 1.

FIG. 4 shows the clock signal (CLK) having a short period, and FIG. 5 shows the clock signal (CLK) having a long period.

As shown in FIG. 4, an external command signal (CMD) is applied to the latency control device, and a latency delay amount is controlled and synchronized with the clock signal (CLK), so that a normal latency signal (L_CMD) is enabled. Thereafter, after the external command signal (CMD) is delayed for a predetermined time, the self-latency signal (S_CMD) is enabled.

On the other hand, in FIG. 5 the external command signal (CMD) is applied to the latency control device such that a latency delay amount is controlled and synchronized with the clock signal (CLK) having one cycle, therefore a normal latency signal (L_CMD) is enabled. In addition, the latency control device is synchronized with a half-cycle clock signal (CLK), so that the self-latency signal (S_CMD) is enabled before the normal latency signal (L_CMD) is enabled.

The latency control circuit of an embodiment may control a latency period in response to a setting of the code signal (CODE) as shown in FIG. 4. As shown in FIG. 4, the self-latency signal (S_CMD) may be delayed more than a maximum delay value (max) of the normal latency signal (L_CMD). In addition, the latency control circuit may control the self-latency signal (S_CMD) as shown in FIG. 5, such that the self-latency signal (S_CMD) is enabled before a minimum delay value (min) of the normal latency signal (L_CMD). Accordingly, as shown in FIG. 5, the latency control device controls a minimum delay unit of the self-latency signal (S_CMD), such that the self-latency signal (S_CMD) is shorter than one cycle of the clock signal (CLK), resulting in improvement of a screen-test throughput.

Figure 6:
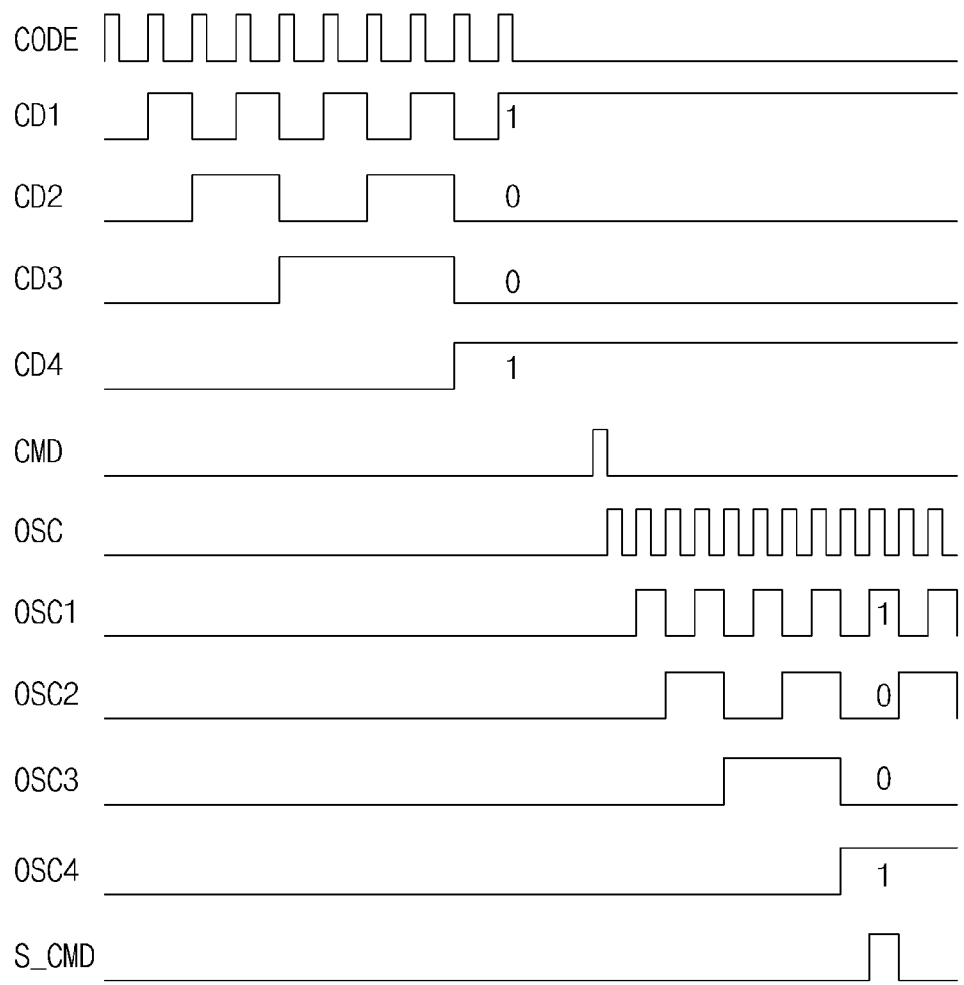
FIG. 6 is a timing diagram illustrating operations of the self-latency unit shown in FIG. 1.

FIG. 6 is a timing diagram illustrating operations of the self-latency unit 200 shown in FIG. 1.

Referring to FIG. 6, the code setting unit 240 may receive a code signal (CODE) that is toggled at intervals of a predetermined time. The flip-flop units (241~244) delay a cycle of the code signal (CODE) so as to sequentially enable the coding signals (CD1~CD4). Although the embodiment of FIG. 2 has shows the code setting unit 240 performing serial setting, in other embodiments, the code setting unit 240 may perform parallel setting.

A second coding signal (CD2) changes to be activated to a high level when the first coding signal (CD1) transitions to a low level. A third coding signal (CD3) changes to be activated to a high level when the second coding signal (CD2) transitions to a low level. In addition, a fourth coding signal (CD4) changes to be activated to a high level when the third coding signal (CD3) transitions to a low level.

The latch unit 210 may delay the command signal (CMD) for a predetermined time. Upon receiving the command signal (CMD), the period control unit 220 may adjust and output the period signal PERIOD<0:M>. Thereafter, the selection unit 230 is controlled by synchronizing the output signal of the period control unit 220 with either the clock signal (CLK) or the selection signal (SEL), and outputs the oscillation signal (OSC). That is, the selection unit 230 may be synchronized with a fixed normal clock signal (CLK) so as to output the oscillation signal (OSC), or the selection unit 230 may be synchronized with an external input period signal PERIOD<0:M> so as to output the oscillation signal (OSC).

For example, if the selection signal (SEL) is at a logic low level, the selection unit 230 is synchronized with the clock signal (CLK) so as to output the oscillation signal (OSC). If the selection signal is at a logic high level, the selection unit 230 is synchronized with the output signal of the period control unit 220 so as to output the oscillation signal (OSC). That is, if the selection unit 230 selects the clock signal (CLK) in response to the selection signal (SEL), the oscillation signal (OSC) is synchronized with the clock signal (CLK) such that a synchronous pulse is output. If the selection unit 230 selects the output signal of the period control unit 220, the oscillation signal (OSC) is output in the form of an asynchronous pulse.

Thereafter, the monitor unit 400 outputs the oscillation signal (OSC) period as the monitoring signal (OSC_OUT). The monitor unit 400 may output the monitoring signal (OSC_OUT) to the controller 10. Accordingly, the controller 10 may monitor the monitoring signal (OSC_OUT) to determine whether or not the period signal controlled by the actual latency circuit is normal. If a desired period signal is not output from the monitor unit 400, the controller 10 may control the period signal PERIOD<0:M> according to the result of the monitoring signal (OSC_OUT), such that the period of the period control unit 220 can be systematically controlled.

An example embodiment has discloses that the oscillation signal (OSC) serving as the output signal of the period control unit 220 is used as a monitoring signal. However, the scope or spirit of the embodiment is not limited thereto, and the self-latency unit 200 may use other internal signals.

Subsequently, the flip-flop units (251~254) of the register unit 250 may divide the period of the oscillation signal (OSC), such that the period signals (OSC1~OSC4) can be sequentially enabled. A second period signal (OSC2) is activated to a high level when a first period signal (OSC1) transitions a low level. A third period signal (OSC3) is activated to a high level when the second period signal (OSC2) transitions a low level. A fourth period signal (OSC4) is activated to a high level when the third period signal (OSC3) transitions a low level.

Thereafter, the comparators (261~265) may compare the output signal of the code setting unit 240 with the output signal of the register unit 250 so as to enable the self-latency signal (S_CMD). That is, the coding signals (CD1~CD4) of the code setting unit 240 are applied to the comparators (261~264), respectively. The period signals (OSC1~OSC4) are respectively applied to the comparators (261~264) after a lapse of a delay time determined by the latch unit 210. Accordingly, the comparator 265 may activate the self-latency signal (S_CMD) when the period signals (OSC1~OSC4) are equal to the coding signals (CD1~CD4), and output the activated self-latency signal (S_CMD).

For example, if the coding signals (CD1~CD4) are divided and output, a logic state is determined according to a high or low pulse shape of each coding signal (CD1~CD4). When the coding signals (CD1~CD4) are output, if the coding signals (CD1~CD4) are set to high-level pulses, a logic state may be 1. If the coding signals (CD1~CD4) are set to low-level pulses, a logic state may be 0.

Likewise, if the period signals (OSC1~OSC4) are divided and output, a logic state is determined according to a high or low pulse shape of each oscillation signal (OSC1~OSC4). When the period signals (OSC1~OSC4) are output, if the period signals (OSC1~OSC4) are set to high-level pulses, the logic state may be 1. If the period signals (OSC1~OSC4) are set to low-level pulses, the logic state may be 0.

In other words, assuming that pulses of the coding signals (CD1~CD4) are set to the code values (1, 0, 0, 1), respectively, if code values of pulses of the period signals (OSC1~OSC4) are equal to the code values (1, 0, 0, 1) of pulses of the coding signals (CD1~CD4), the self-latency signal (S_CMD) is activated to a high level. As described above, the latency control device and the semiconductor device including the same according to the embodiments can adaptively control the latency period according to system specification, resulting in improvement of a screen-test throughput.

Figure 7:
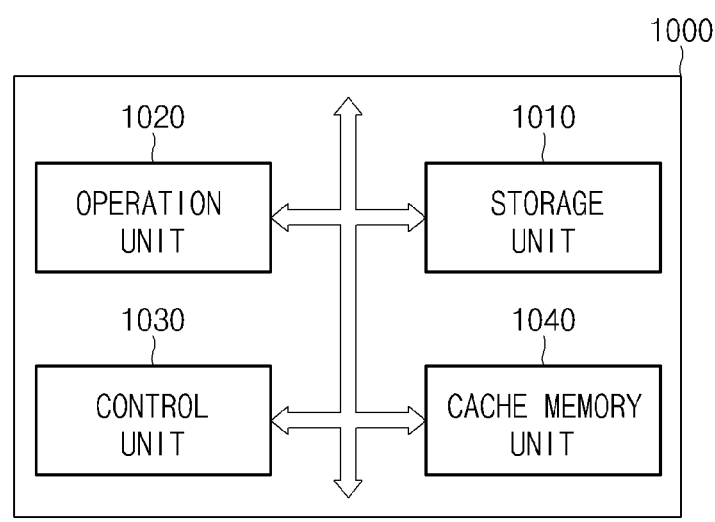
FIG. 7 is a block diagram illustrating a microprocessor according to an embodiment of the inventive concept.

As illustrated in FIG. 7, a microprocessor 1000 to which the semiconductor device according to the embodiment is applied may control and adjust a series of processes, which receive data from various external apparatuses, process the data and transmit processing results to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may temporarily store data to be operated in the operation unit 1020, resulting data performed in the operation unit 1020, and an address in which data to be operated is stored.

The storage unit 1010 may include one of the semiconductor devices according to embodiments. The storage unit 1010 including the semiconductor device according to the above-described embodiments may include a semiconductor device including the controller 10, latency unit 100, self-latency unit 200, selection unit 300 and monitor unit 400 as seen in FIG. 1

The operation unit 1020 may perform an operation in the microprocessor 1000, and perform a variety of four fundamental rules of an arithmetic operation or a logic operation depending on a decryption result of a command in the control unit 1030. The operation unit 1020 may include one or more arithmetic and logic units (ALU).

The control unit 1030 receives a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 suitable for temporarily storing data input from an external apparatus other than the storage unit 1010 or data to be output to an external apparatus. At this time, the cache memory unit 1040 may exchange data from the storage unit 1010, the operation unit 1020, and the control unit 1030 through a bus interface 1050.

Figure 8:
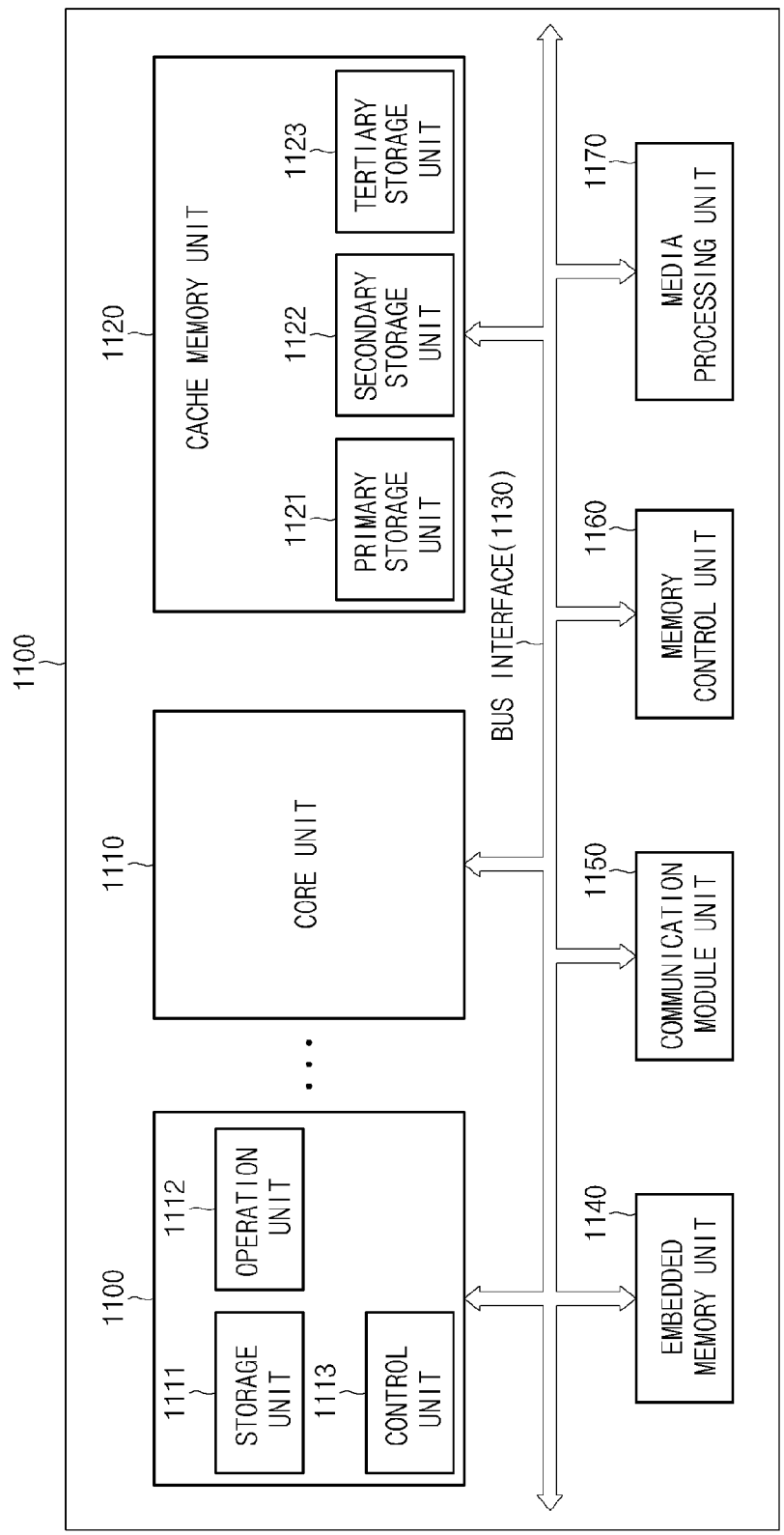
FIG. 8 is a block diagram illustrating a processor according to an embodiment of the inventive concept.

As illustrated in FIG. 8, a processor 1100 according to the embodiment may include various functions to implement performance improvement and multifunction other than the functions of the microprocessor that may control and adjust a series of processes, which receive data from various external apparatuses, process the data and transmit processing results to the external apparatuses. The processor 1100 may include a core unit 1110, a cache memory unit 1120, and a bus interface 1130. The core unit 1110 in the embodiment is a unit may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a GPU, and an AP.

The storage unit 1111 may be a processor register or a register, and the storage unit 1111 may be a unit may store data in the processor 1000 and include a data register, an address register, and a floating point register. The storage unit 1111 may include various registers other than the above-described registers. The storage unit 1111 may temporarily store data to be operated in the operation unit 1112, resulting data performed in the operation unit 1112 and an address in which data to be operated is stored. The operation unit 1112 may be a unit that may perform an operation in the inside of the processor 1100, and perform a variety of four fundamental rules of an arithmetic operation or a logic operation depending on a decryption result of a command in the control unit 1113. The operation unit 1112 may include one or more arithmetic and logic unit (ALU). The control unit 1113 receives a signal from the storage unit 1111, the operation unit 1112, and an external apparatus of the processor 1100, performs extraction or decryption of a command, or input or output control, and executes a process in a program form.

The cache memory unit 1120 may be temporarily store data to supplement a data processing rate of a low speed external apparatus unlike the high speed core unit 1110. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same or different. When the processing rates of the storage units are different, the processing rate of the primary storage unit is the greatest. One or more of the primary storage unit 1121, the secondary storage unit 1122, and the tertiary storage unit 1123 in the cache memory unit may include one of the semiconductor devices according to embodiments. The cache memory unit 1120 including the semiconductor device according to the above-described embodiment may include a semiconductor device including latency control device. The detailed configuration and operation of the semiconductor device may be the same as seen in FIGS. 1-6.

FIG. 5 has illustrated that all the primary, secondary, tertiary storage units 1121, 1122, and 1123 are formed in the cache memory unit 1120. However, all the primary, secondary, tertiary storage units 1121, 1122, and 1123 may be formed in the outside of the cache memory unit 1120, and may supplement a difference between the processing rate of the core unit 1110 and an external apparatus. Further, the primary storage unit 1121 of the cache memory unit 1120 may be located in the core unit 1110, and the secondary storage unit 1122 and the tertiary storage unit 1123 may be formed in the outside of the core unit 1110 to enforce a function to compensate a processing rate.

The bus interface 1130 is a unit that may couple the core unit 1110 and the cache memory unit 1120 to efficiently transmit data.

The processor unit 1100 according to the embodiment may include a plurality of core units 1110, and the core units 1110 may share a cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be formed in each of the core units 1110 corresponding to the number of core units 1110, and the secondary storage unit 1122 and the tertiary storage unit 1123 may be formed in one body in the outsides of the core units 1110 to be shared through the bus interface 1130 Here, the processing rate of the primary storage unit 1121 may be larger than those of the secondary and tertiary storage units 1122 and 1123.

The processor 1100 according to the embodiment may further include an embedded memory unit 1140 that may store data, a communication module unit 1150 that may transmit and receive data from an external apparatus in a wired manner or a wireless manner, a memory control unit 1160 that may drive an external storage device, a media processing unit 1170 that may process data processed in the processor 1100 or data input from an external apparatus and outputting a processing result to an external interface device, and a plurality of modules. At this time, the modules may transmit data to and receive data from the core unit 1110 and the cache memory unit 1120, and transmit and receive data between the modules, through the bus interface 1130.

The embedded memory unit 1140 may include a volatile memory or a nonvolatile memory. The volatile memory may include a dynamic random access memory (DRAM), a mobile DRAM, a static random access memory (SRAM), and the like, and the nonvolatile memory may include a read only memory (ROM), a NOR flash memory, a NAND flash memory, a phase-change random access memory (PRAM), a resistive RAM (RRAM), a spin transfer torque RAM (STTRAM), a magnetic RAM (MRAM), and the like. The semiconductor device according to the embodiment may be applied to the embedded memory unit 1140.

The communication module unit 1150 may include all modules such as a module coupled to a wired network and a module coupled to a wireless network. The wired network module may include a local area network (LAN), a universal serial bus (USB), Ethernet, a power line communication (PLC), and the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may be a unit that may manage data transmitted between the processor 1100 and an external apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multi media card (MMC), an embedded MMC (eMMC), a compact flash (CF) card, or the like.

The media processing unit 1170 may be a unit that may process data processed in the processor 1100 or data input from an external input device and outputting a processing result to an external interface device so that the processing result may be transferred in video, a voice, and other types. The media processing unit 1170 may include a GPU, a DSP, a HD audio, a high definition multimedia interface (HDMI) controller, or the like.

Figure 9:
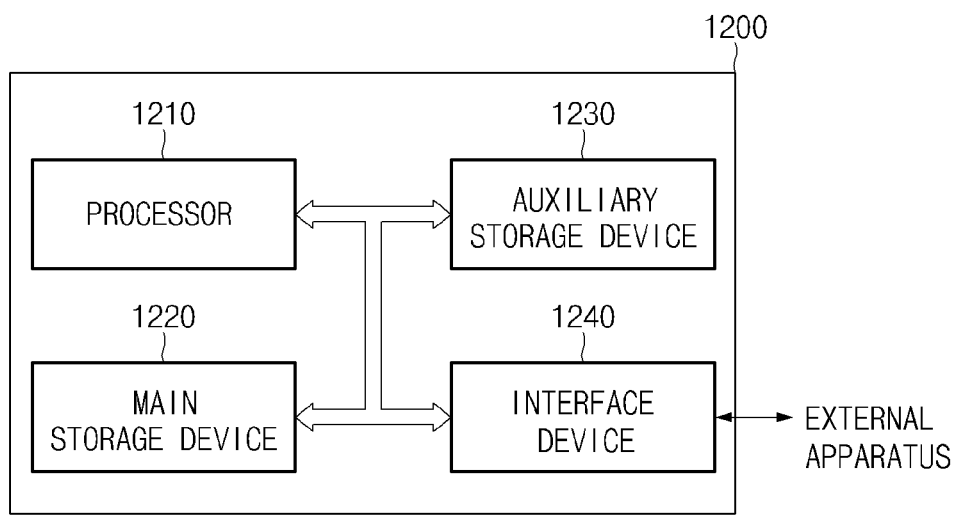
FIG. 9 is a block diagram illustrating a system according to an embodiment of the inventive concept.

As illustrated in FIG. 9, a system 1200 to which the semiconductor device according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate by using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing an operation, comparison, and the like of data stored in the system, and may be formed of a MPU, a CPU, a single/multi core processor, a GPU, an AP, a DSP, or the like.

The main storage unit 1220 is a storage place that may receive a program or data from the auxiliary storage device 1230 and execute the program or the data. The main storage device 1220 retains the stored content even in power off, and may include the semiconductor device according to the above-described embodiment. The main storage device 1220 may use a semiconductor device including a latency control device. The detailed configuration and operation of the semiconductor device may be the same as seen in FIGS. 1-6.

The main storage device 1220 according to the embodiment may further include an SRAM or a DRAM of a volatile memory type in which all contents are erased in power off. Alternatively, the main storage device 1220 may not include the semiconductor device according to the embodiment but may include an SRAM or a DRAM of a volatile memory type in which all contents are erased in power off.

The auxiliary storage device 1230 is a storage device that may store a program code or a data. The auxiliary storage device 1230 may have a lower data processing rate than that of the main storage device 1220, but may store a large amount of data and include the semiconductor device according to the above-described embodiment. The auxiliary storage unit 1230 may also use a semiconductor device including a latency control device. The detailed configuration and operation of the semiconductor device may be the same as shown in FIGS. 1-6.

An area of the auxiliary storage device 1230 according to the embodiment may be decreased, to reduce a size of the system 1200 and increase portability of the system 1200. Further, the auxiliary storage device 1230 may further include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Unlike this, the auxiliary storage device 1230 may not include the semiconductor device according to the above-described embodiment but may include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card.

The interface device 1240 may exchange a command and data of an external apparatus with the system of the embodiment, and may be a keypad, a keyboard, a mouse, a speaker, a mike, a display, a variety of Human Interface Devices (HIDs), or a communication device. The communication device may include all modules such as a module coupled to a wired network or a module coupled to a wireless network. The wired network module may include a LAN, a USB, Ethernet, a power line communication (PLC), or the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

As is apparent from the above description, the latency control device and the semiconductor device including the same according to the embodiments provide the following effects.

First, the latency control device and the semiconductor device including the same can extend the minimum and maximum delay ranges of the delay circuit through setting of a code corresponding to a desired delay amount.

Second, the latency control device and the semiconductor device including the same can improve a screen test throughput using a minimum delay time shorter than a clock period through a clock asynchronous operation.

Those skilled in the art will appreciate that the present invention may be carried out in other specific ways than those set forth herein without departing from the spirit and essential characteristics of the present invention. The above example embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an example embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a latency unit configured to output a normal latency signal synchronized with a clock signal;
    a self-latency unit configured to output a self-latency signal synchronized with the clock signal in response to a selection signal, or control a period of the self-latency signal in an asynchronous manner in response to the selection signal; and
    a selection unit configured to select any one of the normal latency signal and the self-latency signal so as to output a latency control signal.

2. The semiconductor device according to claim 1, wherein the self-latency unit performs setting of a code value having a specific delay amount and controls a delay amount of a period signal in response to a code signal from a controller, and outputs the self-latency signal according to whether the delay result is equal to the code value.

3. The semiconductor device according to claim 1, wherein the self-latency unit includes:
    a code setting unit configured to output a plurality of coding signals by setting a code value having a delay amount in response to a code signal from a controller;
    a latch unit configured to latch a command signal received from the controller for a predetermined time;

a period control unit configured to control a delay amount of a period signal in response to an output signal of the latch unit;

a selection unit configured to output an oscillation signal synchronized with the clock signal in response to the selection signal, or synchronize the oscillation signal with an output signal of the period control unit;

a register unit configured to output a plurality of period signals by dividing the oscillation signal; and a comparator configured to compare the plurality of coding signals with the plurality of period signals so as to output the self-latency signal.

4. The semiconductor device according to claim 3, further comprising:

a monitor unit configured to output the oscillation signal as monitoring signal.

5. The semiconductor device according to claim 3, wherein activation states of the code setting unit, the latch unit, the period control unit, and the register unit are controlled in response to an enable signal received from the controller.

6. The semiconductor device according to claim 3, wherein the code setting unit includes a plurality of flip-flop units coupled in series.

7. The semiconductor device according to claim 3, wherein the code setting unit divides the code signal so as to sequentially enable the plurality of coding signals.

8. The semiconductor device according to claim 3, wherein the code setting unit includes a plurality of flip-flop units coupled in parallel.

9. The semiconductor device according to claim 8, wherein the code setting unit is configured to simultaneously output the plurality of coding signals.

10. The semiconductor device according to claim 3, wherein the latch unit includes an SR latch.

11. The semiconductor device according to claim 3, wherein the register unit includes a plurality of flip-flop units coupled in series.

12. The semiconductor device according to claim 3, wherein the register unit divides the oscillation signal so as to sequentially enable the plurality of period signals.

13. The semiconductor device according to claim 3, wherein the comparator includes:

a plurality of first comparators configured to compare the plurality of coding signals with the plurality of period signals; and a second comparator configured to compare output signals of the plurality of first comparators with each other so as to output the self-latency signal.

14. The semiconductor device according to claim 3, wherein the comparator compares the plurality of coding signals with the plurality of period signals, and enables the self-latency signal when logic values of comparison pulses are equal to each other.

15. The semiconductor device according to claim 1, wherein the self-latency unit controls the self-latency signal to be delayed more than a maximum period value of the normal latency signal.

16. The semiconductor device according to claim 1, wherein the self-latency unit delays the self-latency signal in a manner that the self-latency signal is enabled before a minimum period value of the normal latency signal.

17. The semiconductor device according to claim 1, wherein the self-latency unit controls a minimum delay unit of the self-latency signal to be shorter than one cycle of the clock signal.

18. A latency control device comprising:

a code setting unit configured to output a plurality of coding signals by setting a code value having a specific delay amount in response to a code signal;

a latch unit configured to latch a command signal for a predetermined time;

a period control unit configured to control a delay amount of a period signal in response to an output signal of the latch unit;

a selection unit configured to output an oscillation signal synchronized with the clock signal in response to the selection signal, or synchronize the oscillation signal with an output signal of the period control unit;

a register unit configured to output a plurality of period signals by dividing the oscillation signal; and a comparator configured to compare the plurality of coding signals with the plurality of period signals so as to output the self-latency signal.

19. The latency control device according to claim 18, further comprising:

a monitor unit configured to output the oscillation signal as a monitoring signal.

20. The latency control device according to claim 18, wherein activation states of the code setting unit, the latch unit, the period control unit, and the register unit are controlled in response to an enable signal.

21. The latency control device according to claim 18, wherein the code setting unit includes a plurality of flip-flop units coupled in series.

22. The latency control device according to claim 18, wherein the code setting unit divides the code signal so as to sequentially enable the plurality of coding signals.

23. The latency control device according to claim 18, wherein the code setting unit includes a plurality of flip-flop units coupled in parallel.

24. The latency control device according to claim 23, wherein the code setting unit is configured to simultaneously output the plurality of coding signals.

25. The latency control device according to claim 18, wherein the latch unit includes an SR latch.

26. The latency control device according to claim 18, wherein the register unit includes a plurality of flip-flop units coupled in series.

27. The latency control device according to claim 18, wherein the register unit divides the oscillation signal so as to sequentially enable the plurality of period signals.

28. The latency control device according to claim 18, wherein the comparator includes:

a plurality of first comparators configured to compare the plurality of coding signals with the plurality of period signals; and a second comparator configured to compare output signals of the plurality of first comparators with each other so as to output the self-latency signal.

29. The latency control device according to claim 18, wherein the comparator compares the plurality of coding signals with the plurality of period signals, and activates the self-latency signal when logic values of comparison pulses are equal to each other.

* * * * *